US012650741B2

(12) United States Patent
Hong et al.

(10) Patent No.: US 12,650,741 B2
(45) Date of Patent: Jun. 9, 2026

(54) DISPLAY DEVICE

(71) Applicant: SAMSUNG DISPLAY CO., LTD.,
Yongin-si (KR)

(72) Inventors: Jongbeom Hong, Yongin-si (KR);
Gunshik Kim, Yongin-si (KR);
Youngjun Yoo, Goyang-si (KR)

(73) Assignee: SAMSUNG DISPLAY CO., LTD.,
Yongin-si (KR)

( * ) Notice: Subject to any disclaimer, the term of this
patent is extended or adjusted under 35
U.S.C. 154(b) by 903 days.

(21) Appl. No.: 17/805,052

(22) Filed: Jun. 2, 2022

(65) Prior Publication Data

US 2023/0028122 A1     Jan. 26, 2023

(30) Foreign Application Priority Data

Jul. 15, 2021    (KR) ........................ 10-2021-0092819

(51) Int. Cl.
| | |
|---|---|
| *H01L 27/32* | (2006.01) |
| *G06F 3/041* | (2006.01) |
| *H01L 51/52* | (2006.01) |
| *H10K 59/126* | (2023.01) |
| *H10K 59/80* | (2023.01) |

(Continued)

(52) U.S. Cl.
CPC ......... *G06F 3/0412* (2013.01); *H10K 59/126*
(2023.02); *H10K 59/8791* (2023.02); *H10K*
*59/8792* (2023.02); *G06F 3/0443* (2019.05);
*G06F 3/0446* (2019.05); *G06F 2203/04111*
(2013.01); *G06F 2203/04112* (2013.01); *H10K*
*59/40* (2023.02)

(58) Field of Classification Search
CPC .... G06F 3/0412; G06F 3/0443; G06F 3/0446;
G06F 2203/04111; G06F 2203/04112;
G06F 3/041; H10K 59/126; H10K
59/8791; H10K 59/8792; H10K 59/40;
H10K 59/00–95; H10K 50/00–88; H10K
50/84
See application file for complete search history.

(56) References Cited

U.S. PATENT DOCUMENTS

| | | | |
|---|---|---|---|
| 3,876,555 | A | 4/1975 | Gryaznov et al. |
| 5,360,943 | A | 11/1994 | Mori et al. |
| 8,664,021 | B2 | 3/2014 | Kim et al. |

(Continued)

FOREIGN PATENT DOCUMENTS

| | | |
|---|---|---|
| CN | 111966249 A | 11/2020 |
| KR | 10-1680765 | 11/2016 |
| KR | 10-2017-0077942 A | 7/2017 |

*Primary Examiner* — Khaja Ahmad
*Assistant Examiner* — Rhys Poniente Sheker
(74) *Attorney, Agent, or Firm* — F. CHAU &
ASSOCIATES, LLC

(57) ABSTRACT

A display device includes a display panel, an input sensor, a light blocking pattern, and a window. A distance between an edge of the light blocking pattern and an edge of a first conductive pattern of the input sensor satisfies Formula below:

$$L \geq T \times \tan\left(\arcsin\left(\frac{1}{n1} \times \sin 90°\right)\right)$$

where L represents the distance, T is a thickness of an insulating layer disposed on the upper side of the light blocking pattern, and n1 is a refractive index. The thickness is measured at the edge of the light blocking pattern.

10 Claims, 12 Drawing Sheets

(51) Int. Cl.
    *G06F 3/044*        (2006.01)
    *H10K 59/40*      (2023.01)

(56)              References Cited

U.S. PATENT DOCUMENTS

| | | | |
|---|---|---|---|
| 10,355,055 B2 | 7/2019 | Fujiwara et al. | |
| 2011/0139516 A1* | 6/2011 | Nirmal | G06F 3/0446 |
| | | | 178/18.01 |
| 2017/0317145 A1 | 11/2017 | Hong et al. | |
| 2019/0114011 A1* | 4/2019 | Kim | H10K 59/40 |
| 2019/0221779 A1* | 7/2019 | Jang | H10K 59/126 |
| 2019/0251326 A1* | 8/2019 | Sun | H10K 59/60 |
| 2021/0181572 A1* | 6/2021 | Lai | G02F 1/133528 |
| 2022/0123055 A1* | 4/2022 | Choung | G06F 3/0443 |
| 2022/0221954 A1* | 7/2022 | Ito | G02F 1/133345 |
| 2023/0031048 A1* | 2/2023 | Xiang | G06F 3/0446 |

* cited by examiner

DISPLAY DEVICE

CROSS REFERENCE TO RELATED APPLICATIONS

This U.S. non-provisional patent application claims priority under 35 U.S.C. § 119 of Korean Patent Application No. 10-2021-0092819, filed on Jul. 15, 2021, the entire contents of which are hereby incorporated by reference.

BACKGROUND

The present disclosure herein relates to a display device including a light blocking pattern.

A display device may include a display panel and an input sensor. External light is reflected from a structure of the display device. The reflected light causes the visibility of the image to be degraded. The display device may further include a polarizing plate to reduce the reflectance of external light. However, the polarizing plate lowers the luminance of the image of the display device. An anti-reflection member that may replace the polarizing plate is being developed.

SUMMARY

The present disclosure provides a display device having reduced reflection amount of external light.

According to an embodiment of the present invention, a display device include: a display panel including a light-emitting region and a non-light-emitting region; an input sensor including a first conductive pattern overlapping the non-light-emitting region and extending in a first direction, and an insulating layer disposed on the first conductive pattern, the input sensor being disposed on the display panel; a light blocking pattern overlapping the first conductive pattern and disposed on the insulating layer, an edge of the light blocking pattern being spaced apart from an edge of the first conductive pattern at a first distance when viewed in a plan view; and a window disposed on the light blocking pattern, the first distance between the edge of the light blocking pattern and the edge of the first conductive pattern in a second direction orthogonal to the first direction satisfies Formula 1 below:

$$L \geq T \times \tan\left(\arcsin\left(\frac{1}{n1} \times \sin 90°\right)\right) \qquad \text{[Formula 1]}$$

where L represents the first distance, T represents a thickness of the insulating layer measured at the edge of the light blocking pattern, and n1 represents a refractive index of the insulating layer.

According to an embodiment of the present invention, a display device may include: a display panel including a light-emitting element disposed in a light-emitting region, and a thin film encapsulation layer overlapping the light-emitting region and a non-light-emitting region adjacent to the light-emitting region and covering the light-emitting element; an input sensor including a first insulating layer disposed on the thin film encapsulation layer, a first conductive pattern disposed on the first insulating layer and extending in a first direction, a second insulating layer disposed on the first conductive pattern, a second conductive pattern disposed on the second insulating layer and electrically connected to the first conductive pattern, and a third insulating layer disposed on the second conductive pattern;

a light blocking pattern overlapping the first conductive pattern and the second conductive pattern and disposed on the third insulating layer, an edge of the light blocking pattern being spaced apart from an edge of the first conductive pattern in a second direction orthogonal to the first direction at a first distance when viewed in a plan view; and a window disposed on the third insulating layer. The first distance between the edge of the light blocking pattern and an edge of the first conductive pattern in a second direction orthogonal to the first direction may satisfy Formulae 1 to 3 below:

$$L \geq L1 + L2 \qquad \text{[Formula 1]}$$

$$L1 = T1 \times \tan\left(\arcsin\left(\frac{1}{n1} \times \sin 90°\right)\right) \qquad \text{[Formula 2]}$$

$$L2 = T2 \times \tan\left(\arcsin\left(\frac{1}{n2} \times \sin 90°\right)\right) \qquad \text{[Formula 3]}$$

where L represents the first distance, T1 represents a thickness of the second insulating layer, n1 represents a refractive index of the second insulating layer, T2 represents a thickness of the third insulating layer, and n2 represents a refractive index of the third insulating layer.

According to an embodiment of the present invention, a display device may include: a display panel; a conductive pattern disposed on the display panel; a plurality of insulating layers disposed on the conductive pattern, a number of the plurality of insulating layers being equal to or greater than 3; and a light blocking pattern overlapping the conductive pattern and disposed on the plurality of insulating layers, an edge of the light blocking pattern being spaced apart from an edge of the conductive pattern in a width direction of the conductive pattern at a first distance when viewed in a plan view. The first distance between an edge of the light blocking pattern and an edge of the conductive pattern in the width direction of the conductive pattern may satisfy Formulae 1 to 4 below.

$$L \geq L1 + L2 \ldots + Lm \qquad \text{[Formula 1]}$$

$$L1 = T1 \times \tan\left(\arcsin\left(\frac{1}{n1} \times \sin 90°\right)\right) \qquad \text{[Formula 2]}$$

$$L2 = T2 \times \tan\left(\arcsin\left(\frac{1}{n2} \times \sin 90°\right)\right) \qquad \text{[Formula 3]}$$

$$Lm = Tm \times \tan\left(\arcsin\left(\frac{1}{nm} \times \sin 90°\right)\right) \qquad \text{[Formula 4]}$$

where L represents the first distance between the edge of the light blocking pattern and the edge of the conductive pattern in the width direction of the conductive pattern, T1 represents a thickness of a first insulating layer, n1 represents a refractive index of the first insulating layer, T2 represents a thickness of a second insulating layer, n2 represents a refractive index of the second insulating layer, Tm represents a thickness of an uppermost insulating layer, and nm represents a refractive index of the uppermost insulating layer.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings:

FIGS. 8 and 9 are cross-sectional views illustrating paths of light reflected from an input sensor according to an embodiment of the inventive concept;

DETAILED DESCRIPTION

Figure 1:
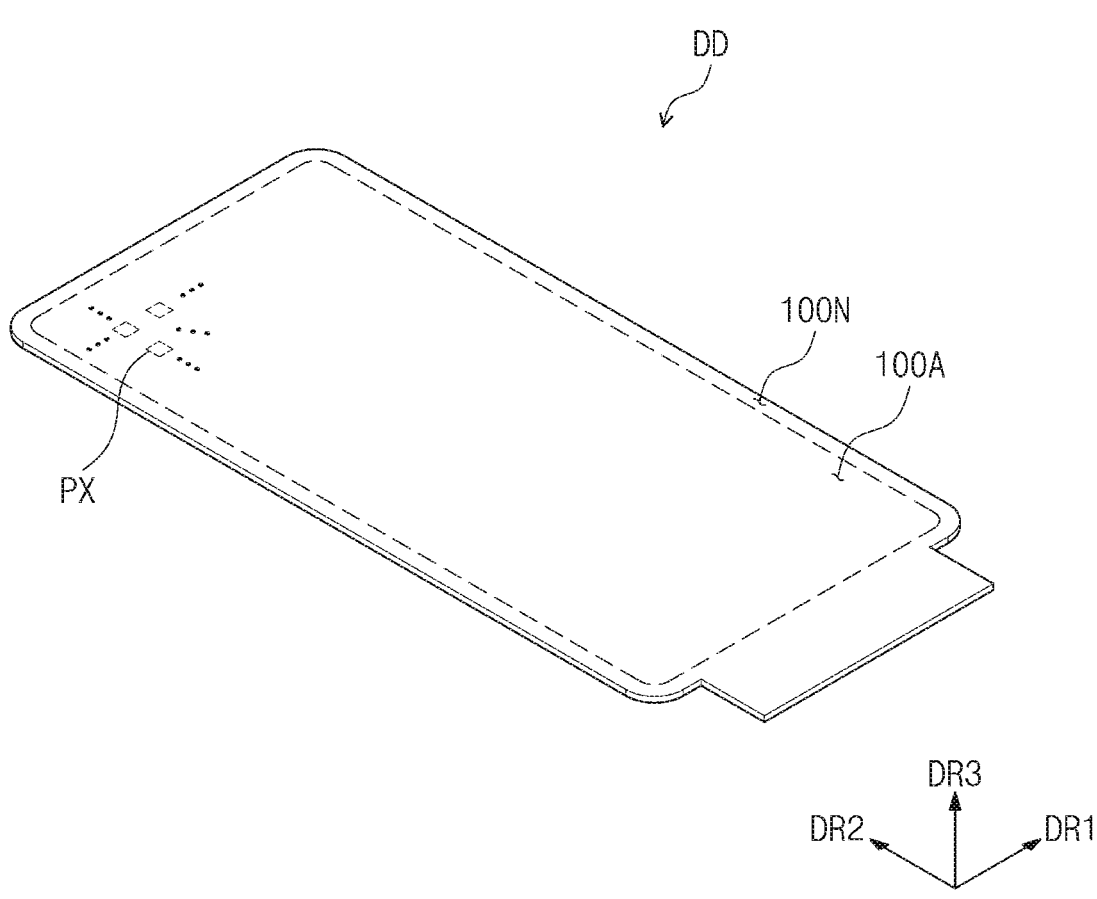
FIG. 1 is a perspective view of a display device according to an embodiment of the inventive concept.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

Like reference numerals or symbols refer to like elements throughout. The thickness and the ratio and the dimension of the element are exaggerated for effective description of the technical contents. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the inventive concept will be described with reference to the accompanying drawings.

Hereinafter, embodiments of the inventive concept will be described with reference to the accompanying drawings.

FIG. 1 is a perspective view of a display device DD according to an embodiment of the inventive concept.

The display device DD may generate an image and sense an external input. The display device DD may include a display region 100A and a peripheral region 100N. A pixel PX is disposed in the display region 100A. The pixel PX may include a first color pixel, a second color pixel, and a third color pixel that generate light of different colors.

The display region 100A may display an image. The display region 100A may include a plane defined by a first direction DR1 and a second direction DR2. The display region 100A may further include curved surfaces respectively bent from at least two sides of the plane. However, the shape of the display region 100A is not limited thereto. For example, the display region 100A may include only the plane, and the display region 100A may include two or more curved surfaces. In some embodiments, the display region '00A may have four curved surfaces bent from four sides of the plane, respectively.

Figure 2:
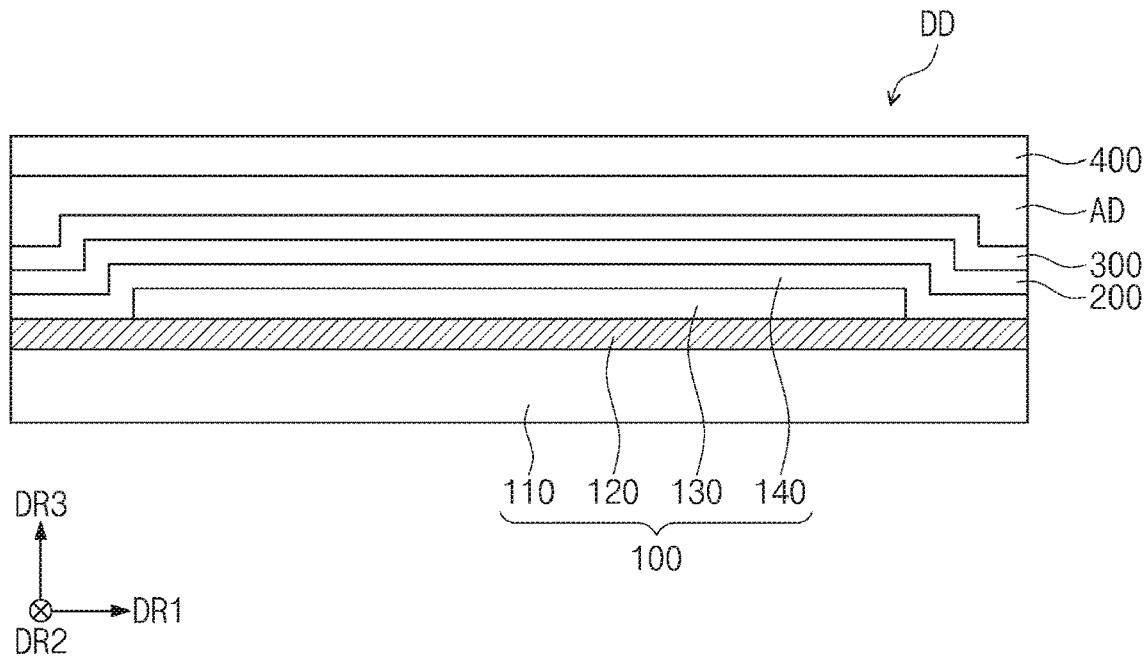
FIG. 2 is a cross-sectional view of a display device according to an embodiment of the inventive concept.

FIG. 2 is a cross-sectional view of a display device DD according to an embodiment of the inventive concept. Referring to FIG. 2, the display device DD may include a display panel 100, an input sensor 200, an anti-reflection member 300 (anti-reflector), and a window 400.

The display panel 100 may be a light-emitting display panel. In some embodiments, the display panel 100 may be an organic light-emitting display panel, an inorganic light-emitting display panel, a micro light-emitting diode (LED) display panel, or a nano LED display panel. The display panel 100 may include a base layer 110, a circuit layer 120, a light-emitting element layer 130, and an encapsulation layer 140.

The base layer 110 may provide a base surface on which the circuit layer 120 is disposed. The base layer 110 may be a rigid substrate or a flexible substrate capable of bending, folding, or rolling, for example. The base layer 110 may be a glass substrate, a metal substrate, or a polymer substrate. However, an embodiment of the inventive concept is not limited thereto, and the base layer 110 may include or may be formed of an inorganic layer, an organic layer or a composite material layer.

The base layer 110 may have a multilayer structure. For example, the base layer 110 may include or may be formed of a first synthetic resin layer, a multi-layered or single-layered inorganic layer, and a second synthetic resin layer disposed on the multi-layered or single-layered inorganic layer. Each of the first and second synthetic resin layers may include or may be formed of a polyimide-based resin. The present invention is not limited thereto.

The circuit layer 120 may be disposed on the base layer 110. The circuit layer 120 may include an insulating layer, a semiconductor pattern, a conductive pattern, a signal line, etc. The circuit layer 120 may include a driving circuit of the pixel PX described with reference to FIG. 1.

The light-emitting element layer 130 may be disposed on the circuit layer 120. The light-emitting element layer 130 may include a light-emitting element of the pixel PX described with reference to FIG. 1. For example, the light-emitting element may include an organic light-emitting material, an inorganic light-emitting material, an organic-inorganic light-emitting material, a quantum dot, a quantum rod, a micro-LED, or a nano-LED.

The encapsulation layer 140 may be disposed on the light-emitting element layer 130. The encapsulation layer 140 may protect the light-emitting element layer 130 from foreign substances such as moisture, oxygen, and dust particles. The encapsulation layer 140 may include or may be formed of at least one inorganic layer. The encapsulation layer 140 may include or may be a stacked structure of an inorganic layer/organic layer/inorganic layer.

The input sensor 200 may be disposed on the display panel 100. The input sensor 200 may detect an external input applied from the outside. The external input may be a user's input. The user's input may include various types of external inputs, such as a part of the user's body, light, heat, pen, and pressure.

The input sensor 200 may be formed on the display panel 100 through a continuous process. In this case, the input sensor 200 may be directly disposed on the display panel 100. In this specification, the wording, "a configuration B is directly disposed on a configuration A" may mean that a third component is not disposed between the configuration A and the configuration B. For example, an adhesive layer may not be disposed between the input sensor 200 and the display panel 100.

The anti-reflection member 300 may be disposed on the input sensor 200. The anti-reflection member 300 may reduce the reflectance of external light. The anti-reflection member 300 may be directly disposed on the input sensor 200 through a continuous process.

The anti-reflection member 300 may include a light blocking pattern that overlaps a reflective structure disposed under the anti-reflection member 300. The anti-reflection member 300 may further include a color filter overlapping a light-emitting region to be described later. The color filter may include a first color filter, a second color filter, and a third color filter respectively corresponding to the first color pixel, the second color pixel, and the third color pixel. A detailed description of the anti-reflection member 300 will be described later.

The window 400 is disposed on the anti-reflection member 300. The window 400 and the anti-reflection member 300 may be bonded by an adhesive layer AD. The adhesive layer may be a pressure sensitive adhesive film (PSA) or an optically clear adhesive (OCA).

The window 400 include at least one base layer. The base layer may be a glass substrate or a synthetic resin film. The window 400 may have a multilayer structure. The window 400 may include or may be formed of a thin-film glass substrate and a synthetic resin film disposed on the thin-film glass substrate. The thin-film glass substrate and the synthetic resin film may be bonded by an adhesive layer, and the adhesive layer and the synthetic resin film may be separated from the thin-film glass substrate for the replacement thereof.

In an embodiment of the inventive concept, the adhesive layer AD may be omitted, and the window 400 may be disposed directly on the anti-reflection member 300. An organic material, an inorganic material, or a ceramic material may be applied on the anti-reflection member 300.

Figure 3:
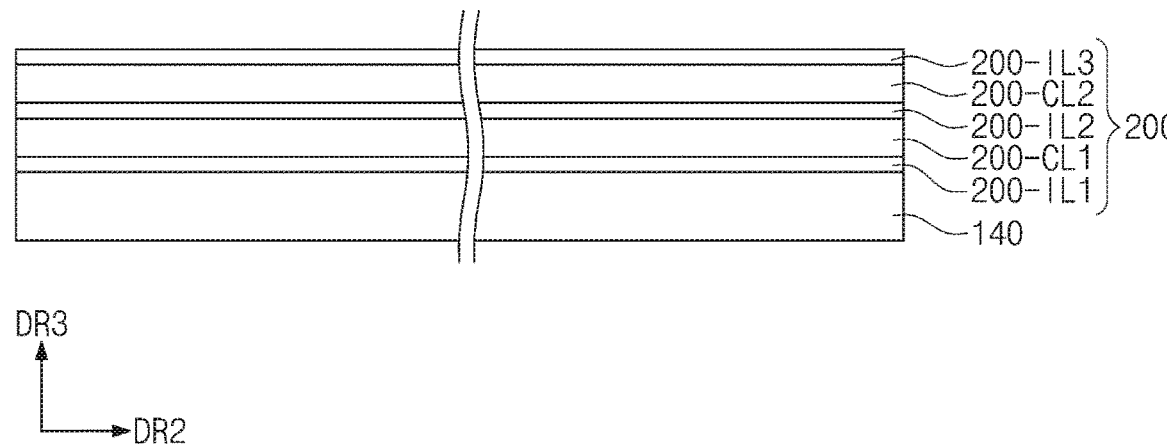
FIG. 3 is a cross-sectional view of an input sensor according to an embodiment of the inventive concept.
Figure 4:
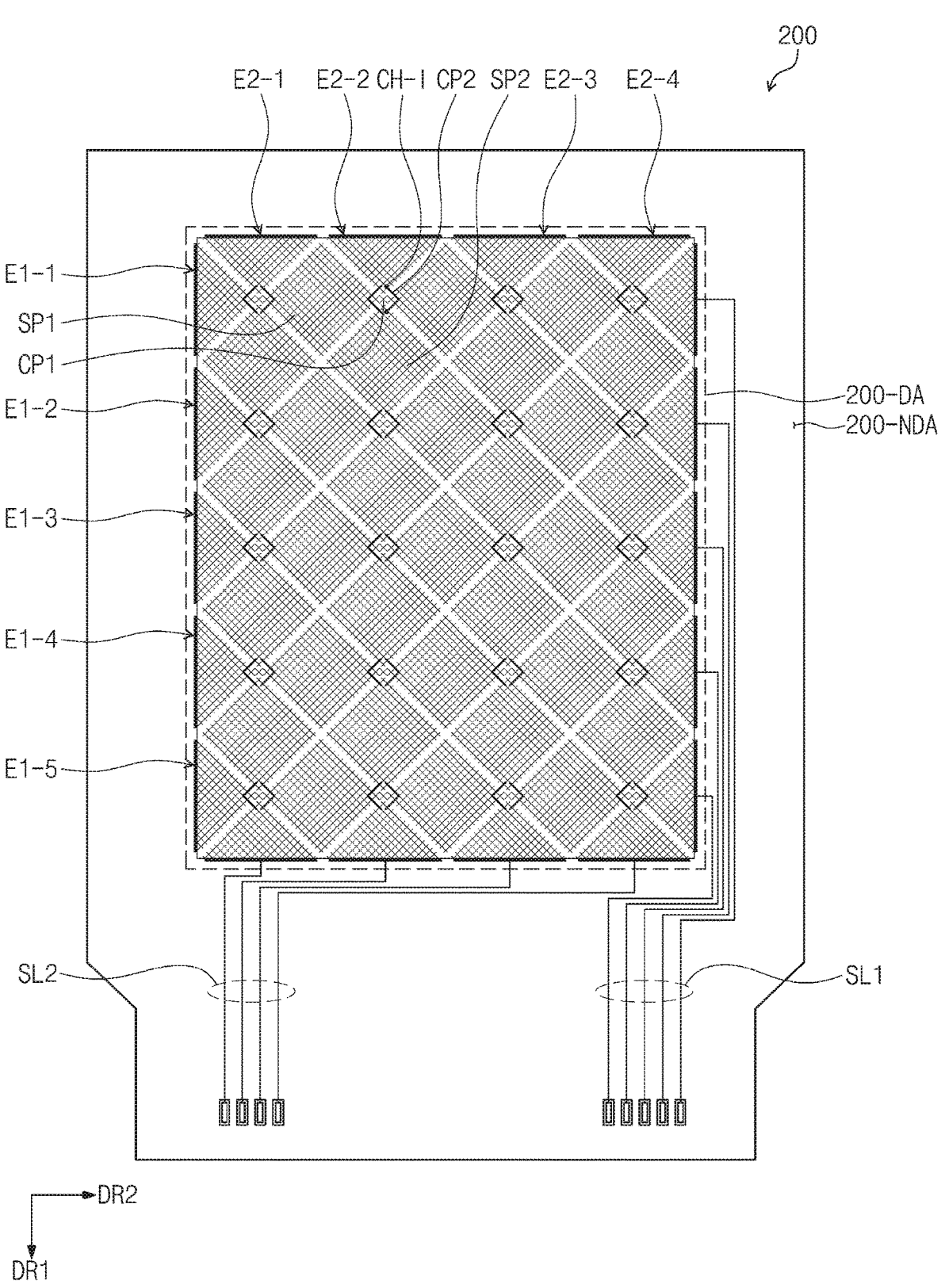
FIG. 4 is a plan view of an input sensor according to an embodiment of the inventive concept.

FIG. 3 is a cross-sectional view of the input sensor 200 according to an embodiment of the inventive concept. FIG. 4 is a plan view of the input sensor 200 according to an embodiment of the inventive concept.

The input sensor 200 may include a first insulating layer 200-IL1 (or base insulating layer), a first conductive pattern layer 200-CL1, a second insulating layer 200-IL2 (or intermediate insulating layer), a second conductive pattern layer 200-CL2, and a third insulating layer 200-IL3 (or cover insulating layer). The first insulating layer 200-IL1 may be directly disposed on the encapsulation layer 140.

In an embodiment of the inventive concept, the first insulating layer 200-IL1 and/or the third insulating layer 200-IL3 may be omitted. When the first insulating layer 200-IL1 is omitted, the first conductive pattern layer 200-CL1 may be disposed on the uppermost insulating layer of the encapsulation layer 140. The third insulating layer 200-IL3 may be replaced with an adhesive layer or an insulating layer of the anti-reflection member 300 disposed on the input sensor 200.

The first conductive pattern layer 200-CL1 may include first conductive patterns, and the second conductive pattern layer 200-CL2 may include second conductive patterns. Hereinafter, the first conductive pattern layer 200-CL1 and the first conductive patterns are denoted as like reference numerals or symbols, and the second conductive pattern layer 200-CL2 and second conductive patterns are denoted as like reference numerals or symbols.

Each of the first conductive patterns 200-CL1 and the second conductive patterns 200-CL2 may have a single-layer structure or a multilayer structure stacked along the third direction axis DR3. The multilayered conductive pattern may include at least two among transparent conductive layers and metal layers. The multilayered conductive pattern may include metal layers containing different metals. The transparent conductive layers may include or may be formed of indium tin oxide (ITO), indium zinc oxide (IZO), zinc oxide (ZnO), indium tin zinc oxide (ITZO), PEDOT, metal nanowires, or graphene. The metal layer may include or may be formed of molybdenum, silver, titanium, copper, aluminum, or alloys thereof. A detailed description of the stacked structure of each of the first conductive pattern layer 200-CL1 and the second conductive pattern layer 200-CL2 will be described later.

In some embodiments, each of the first insulating layer 200-IL1 to the third insulating layer 200-IL3 may include or may be formed of an inorganic layer or an organic layer. In some embodiments, the first insulating layer 200-IL1 to the third insulating layer 200-IL3 may include or may be formed of an inorganic layer. The inorganic layer may include or may be formed of silicon oxide, silicon nitride, or silicon oxynitride.

In an embodiment of the inventive concept, at least one among the first insulating layer 200-IL1 to the third insulating layer 200-IL3 may be an organic layer. For example, the third insulating layer 200-IL3 may include or may be formed of an organic layer. The organic layer may include or may be formed of at least one of acrylic resin, methacrylic resin, polyisoprene, vinyl resin, epoxy resin, urethane resin, cellulose resin, siloxane resin, polyimide resin, polyamide resin, and perylene resin.

Referring to FIG. 4, the input sensor 200 includes a sensing region 200-DA and a non-sensing region 200-NDA adjacent to the sensing region 200-DA. The sensing region 200-DA and the non-sensing region 200-NDA respectively correspond to the display region 100A and the peripheral region 100N illustrated in FIG. 1.

The input sensor 200 includes first electrodes E1-1 to E1-5 and second electrodes E2-1 to E2-4 that are disposed in the sensing region 200-DA, and are mutually insulated and cross each other. The input sensor 200 includes first signal lines SL1 and second signal lines SL2 disposed in the non-sensing region 200-NDA, and the first signal lines SL1 are electrically connected to the first electrodes E1-1 to E1-5 and the second signal lines SL2 are electrically connected to the second electrodes E2-1 to E2-4. The first electrodes E1-1 to E1-5, the second electrodes E2-1 to E2-4, the first signal lines SL1, and the second signal lines SL2 may be defined by a combination of the first conductive patterns 200-CL1 and the second conductive patterns 200-CL2 described with reference to FIG. 3.

Each of the first electrodes E1-1 to E1-5 and the second electrodes E2-1 to E2-4 may include a plurality of conductive lines crossing each other. The plurality of conductive lines may define a plurality of openings, and the first electrodes E1-1 to E1-5 and the second electrodes E2-1 to E2-4 may each have a mesh shape. Each of the plurality of openings may be defined to correspond to a light-emitting region LA (see FIG. 5) of the display panel DP.

The first electrodes E1-1 to E1-5 and/or the second electrodes E2-1 to E2-4 may have an integral shape. In some embodiments, the first electrodes E1-1 to E1-5 having an integral shape are exemplarily illustrated. The first electrodes E1-1 to E1-5 may include sensing portions SP1 and intermediate portions CP1. A portion of the above-described second conductive patterns 200-CL2 may correspond to the first electrodes E1-1 to E1-5.

Each of the second electrodes E2-1 to E2-4 may include sensing patterns SP2 and bridge patterns CP2 (or connection patterns). Two adjacent sensing patterns SP2 may be connected to two bridge patterns CP2 through contact holes CH-I passing through the second insulating layer 200-IL2 (see FIG. 3), but the number of the bridge patterns is not limited thereto. A portion of the above-described second conductive patterns 200-CL2 may correspond to the sensing patterns SP2. A portion of the above-described first conductive patterns 200-CL1 may correspond to the bridge patterns CP2.

In some embodiments, it is described that the bridge patterns CP2 are formed from the first conductive patterns 200-CL1 illustrated in FIG. 3 and that the first electrodes E1-1 to E1-5 and the sensing patterns SP2 are formed from the second conductive patterns 200-CL2. The present invention, however, is not limited thereto. In some embodiments, the first electrodes E1-1 to E1-5 and sensing patterns SP2 may be formed from the first conductive patterns 200-CL1 illustrated in FIG. 3, and bridge patterns CP2 may be formed from the second conductive patterns 200-CL2.

One among the first signal lines SL1 and the second signal lines SL2 transfer a transmission signal for detecting an external input from an external circuit, and the other transfer a change in capacitance between the first electrodes E1-1 to E1-5 and the second electrodes E2-1 to E2-5 as a reception signal to an external circuit.

A portion of the above-described second conductive patterns 200-CL2 may correspond to the first signal lines SL1 and the second signal lines SL2. The first signal lines SL1 and the second signal lines SL2 may have multilayer structures and may each include a first layer line formed from the above-described first conductive patterns 200-CL1 and a second layer line formed from the above-described second conductive patterns 200-CL2. The first layer line and the second layer line may be connected through a contact hole penetrating the second insulating layer 200-IL2 (see FIG. 3).

Figure 5:
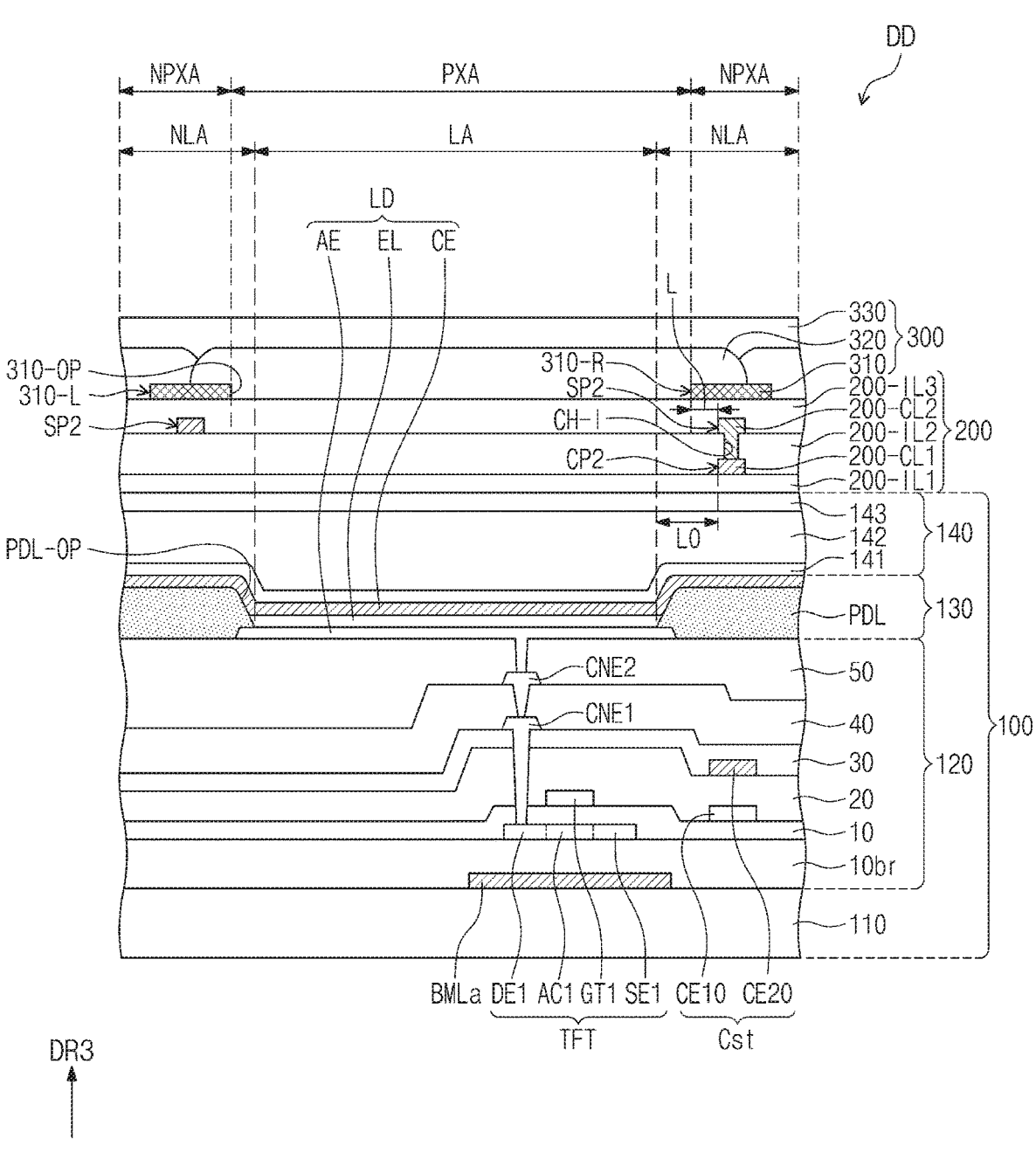
FIG. 5 is a detailed cross-sectional view of a display device according to an embodiment of the inventive concept.

FIG. 5 is a detailed cross-sectional view of a display device DD according to an embodiment of the inventive concept. FIG. 5 illustrates a cross-section corresponding to one light-emitting region LA and a peripheral non-light-emitting region NLA. FIG. 5 illustrates a light-emitting element LD and a transistor TFT connected thereto. The transistor may be one of a plurality of transistors included in the driving circuit of the pixel PX. In some embodiments, the transistor TFT is described as a silicon transistor, but may also be a metal oxide transistor.

A buffer layer 10*br* may be disposed on the base layer 110. The buffer layer 10*br* may prevent diffusion of metal atoms or impurities from the base layer 110 into a semiconductor pattern disposed above the base layer 110. The semiconductor pattern includes an active region AC1 of the transistor TFT.

A back metal layer BMLa may be disposed under the transistor TFT. The back metal layer BMLa may block external light from reaching the transistor TFT. The back metal layer BMLa may be disposed between the base layer 110 and the buffer layer 10*br*. In an embodiment of the inventive concept, an inorganic barrier layer may be further disposed between the back metal layer BMLa and the buffer layer 10*br*. The back metal layer BMLa may be connected to an electrode or a wiring, and may receive a constant voltage or a signal from the electrode or wiring.

The semiconductor pattern may be disposed on the buffer layer 10*br*. The semiconductor pattern may include or may be formed of a silicon semiconductor. For example, the silicon semiconductor may be amorphous silicon, or polycrystalline silicon. For example, the semiconductor pattern may include or may be formed of low-temperature polysilicon.

The semiconductor pattern may include a first region having high conductivity and a second region having low conductivity. The first region may be doped with an N-type dopant or a P-type dopant. A P-type transistor may include a doped region doped with a P-type dopant, and an N-type transistor may include a doped region doped with an N-type dopant. The second region may be an undoped region or a region having a lower doping concentration than the first region.

The conductivity of the first region is greater than that of the second region, and the first region may substantially serve as an electrode or a signal line. The second region may substantially correspond to an active region (or channel) of the transistor. In other words, a portion of the semiconductor pattern may be an active region of the transistor, another portion may be a source or drain of the transistor, and further another portion may be a connection electrode or a connection signal line.

A source region SE1 (or source), an active region AC1 (or channel), and a drain region DE1 (or drain) of the transistor TFT may be formed from the semiconductor pattern. The source region SE1 and the drain region DE1 may extend in opposite directions from the active region AC1, on a cross-section.

A first insulating layer 10 may be disposed on the buffer layer 10*br*. The first insulating layer 10 may overlap the plurality of pixels PX (see FIG. 1) in common and may cover the semiconductor pattern. The first insulating layer 10 may include an inorganic layer and/or organic layer, and may have a single-layer or multilayer structure. The inorganic layer may include at least one of aluminum oxide, titanium oxide, silicon oxide, silicon nitride, silicon oxynitride, zirconium oxide, and hafnium oxide. In some embodiments, the first insulating layer 10 may be a single silicon oxide layer. Not only the first insulating layer 10 but also the insulating layer of the circuit layer 120 to be described later may be an inorganic layer and/or an organic layer, and may have a single-layer or multilayer structure. The inorganic layer may include at least one of the above-described materials. The present invention, however, is not limited thereto.

A gate GT1 of the transistor TFT is disposed on the first insulating layer 10. The gate GT1 may be a portion of a metal pattern. The gate GT1 overlaps the active region AC1. In the process of doping the semiconductor pattern, the gate GT1 may function as a mask. The gate GT1 may include or may be formed of titanium (Ti), silver (Ag), Ag-containing alloy, molybdenum (Mo), Mo-containing alloy, aluminum (Al), Al-containing alloy, aluminum nitride (AlN), tungsten (W), tungsten nitride (WN), copper (Cu), indium tin oxide (ITO), or indium zinc oxide (IZO). The present invention is, however, not limited thereto.

A second insulating layer 20 may be disposed on the first insulating layer 10 and may cover the gate GT1. A third insulating layer 30 may be disposed on the second insulating layer 20. A second electrode CE20 of the storage capacitor Cst may be disposed between the second insulating layer 20 and the third insulating layer 30. In addition, a first electrode CE10 of the storage capacitor Cst may be disposed between the first insulating layer 10 and the second insulating layer 20.

A first connection electrode CNE1 may be disposed on the third insulating layer 30. The first connection electrode CNE1 may be connected to the drain region DE1 of the transistor TFT through a contact hole passing through the first to third insulating layers 10, 20, and 30.

A fourth insulating layer 40 may be disposed on the third insulating layer 30. A second connection electrode CNE2 may be disposed on the fourth insulating layer 40. The second connection electrode CNE2 may be connected to the first connection electrode CNE1 through a contact hole passing through the fourth insulating layer 40. A fifth insulating layer 50 is disposed on the fourth insulating layer 40 and may cover the second connection electrode CNE2. The stacked structure of the first insulating layer 10 to the fifth insulating layer 50 is only an example, and an additional conductive layer and an insulating layer may be further provided, in addition to the first insulating layer 10 to the fifth insulating layer 50.

Each of the fourth insulating layer 40 and the fifth insulating layer 50 may be an organic layer. For example, the organic layer may include benzo cyclobutene (BCB), polyimide, hexamethyldisiloxane (HMDSO), a general-purpose polymer such as polymethylmethacrylate (PMMA) and polystyrene (PS), a polymer derivative having a phenolic group, an acrylic polymer, an imide-based polymer, an arylether-based polymer, an amide-based polymer, a fluorine-based polymer, a p-xylene-based polymer, a vinyl alcohol-based polymer, or a blend thereof.

The light-emitting element LD may include a first electrode AE (or pixel electrode), a light-emitting layer EL, and a second electrode CE (or a common electrode). The first electrode AE may be disposed on the fifth insulating layer 50. The first electrode AE may be a (semi)transmissive electrode or a reflective electrode. The first electrode AE may include a reflective layer formed of Ag, Mg, Al, Pt, Pd, Au, Ni, Nd, Ir, Cr, or a compound thereof, and a transparent or semi-transparent electrode layer formed on the reflective layer. The transparent or semi-transparent electrode layer may include at least one selected from the group consisting of indium tin oxide (ITO), indium zinc oxide (IZO), indium gallium zinc oxide (IGZO), zinc oxide (ZnO), indium oxide (In$_2$O$_3$), and aluminum doped zinc oxide (AZO). For example, the first electrode AE may include or may be a stacked structure of ITO/Ag/ITO.

The pixel defining layer PDL may be disposed on the fifth insulating layer 50. According to an embodiment, the pixel defining layer PDL may have a light absorbing property, and may have, for example, a black color. The pixel defining layer PDL may include a black coloring agent. The black coloring agent may include a black dye or a black pigment. The present invention is not limited thereto. In some embodiments, the black coloring agent may include carbon black, metal such as chromium, or a metal oxide. The pixel defining layer PDL may correspond to a light blocking pattern having light blocking characteristics.

The pixel defining layer PDL may cover a portion of the first electrode AE. In some embodiments, the pixel defining layer PDL may cover an edge of the first electrode AE. An opening PDL-OP exposing a portion of the first electrode AE may be defined in the pixel defining layer PDL. The opening PDL-OP of the pixel defining layer PDL may define the light-emitting region LA.

The pixel defining layer PDL may increase the distance between the second electrode CE and an edge of the first electrode AE. In some embodiments, the pixel defining layer PDL may be disposed between the edge of the first electrode AE and the second electrode CE. Accordingly, the pixel defining layer PDL may serve to prevent an arc from occurring at the edge of the first electrode AE.

Although not illustrated, a hole control layer may be disposed between the first electrode AE and the light-emitting layer EL. The hole control layer may include a hole transport layer, and may further include a hole injection layer. An electronic control layer may be disposed between the light-emitting layer EL and the second electrode CE. The electron control layer may include an electron transport layer and may further include an electron injection layer.

The encapsulation layer 140 may be disposed on the light-emitting element layer 130. The encapsulation layer 140 may include an inorganic layer 141, an organic layer 142, and an inorganic layer 143 that are sequentially stacked on each other. The present invention, however, is not limited thereto.

The inorganic layers 141 and 143 may protect the light-emitting element layer 130 from moisture and oxygen, and the organic layer 142 may protect the light-emitting element layer 130 from foreign substances such as dust particles. Each of the inorganic layers 141 and 143 may include a silicon nitride layer, a silicon oxynitride layer, a silicon oxide layer, a titanium oxide layer, or an aluminum oxide layer. The organic layer may include or may be formed of an acrylic organic layer. The present invention, however, is not limited thereto.

The input sensor 200 may be disposed on the display panel 100. The bridge pattern CP2 which is the first conductive pattern 200-CL1 is disposed on the first insulating layer 200-IL1. The sensing pattern SP2 formed from the second conductive pattern 200-CL2 is disposed on the second insulating layer 200-IL2.

Referring to FIG. 5, a first portion (or a right portion) of the second conductive pattern 200-CL2 may overlap the bridge pattern CP2, and a second portion (or a left portion) of the second conductive pattern 200-CL2 may not overlap the bridge pattern CP2. The first portion of the second conductive pattern 200-CL2 and the second portion of the second conductive pattern 200-CL2 may be a conductive line of the sensing pattern SP2 illustrated in FIG. 4.

The anti-reflection member 300 may be disposed on the input sensor 200. The anti-reflection member 300 may include a light blocking pattern 310, a color filter 320, and a planarization layer 330.

The light blocking pattern 310 is a layer having a black color, and in an embodiment, the light blocking pattern 310 may include a black coloring agent. The black coloring agent may include a black dye or a black pigment. The present invention is not limited thereto. In some embodiments, the black coloring agent may include carbon black, metal such as chromium, or a metal oxide. A material constituting the light blocking pattern 310 is not limited thereto, as long as it is a material that absorbs light.

The light blocking pattern 310 may overlap the bridge pattern CP2 and the sensing pattern SP2 on a plane. FIG. 5 illustrates a first portion 310-R and a second portion 310-L of the light blocking pattern 310. The first portion 310-R overlaps the bridge pattern CP2, and the second portion 310-L does not overlap the bridge pattern CP2.

Although not illustrated, the light blocking pattern 310 may overlap the conductive lines of the first electrodes E1-1 to E1-5 (see FIG. 4) on a plane.

The light blocking pattern 310 may prevent external light reflection by the first conductive patterns 200-CL1 and the second conductive patterns 200-CL2. A detailed description thereof will be provided later.

An opening 310-OP may be defined in the light blocking pattern 310. The opening 310-OP of the light blocking pattern 310 may overlap the first electrode AE and may have a larger area than the opening PDL-OP of the pixel defining layer PDL. The opening 310-OP of the light blocking pattern 310 may define a pixel region PXA. The pixel region PXA may be defined as a region in which light generated by the light-emitting element LD is emitted to the outside. As an area of the pixel region PXA increases, the luminance of the image may increase.

The color filter 320 may overlap at least the pixel region PXA. The color filter 320 may further overlap a non-pixel region NPXA. A portion of the color filter 320 may be disposed on the light blocking pattern 310. The color filter 320 may transmit light generated by the light-emitting element LD, and block, among external light, light of some wavelength bands. Accordingly, the color filter 320 may reduce external light reflection by the first electrode AE or the second electrode CE.

A planarization layer 330 may cover the light blocking pattern 310 and the color filter 320. The planarization layer 330 may include or may be formed of an organic material, and provide a flat top surface.

Figure 6A:
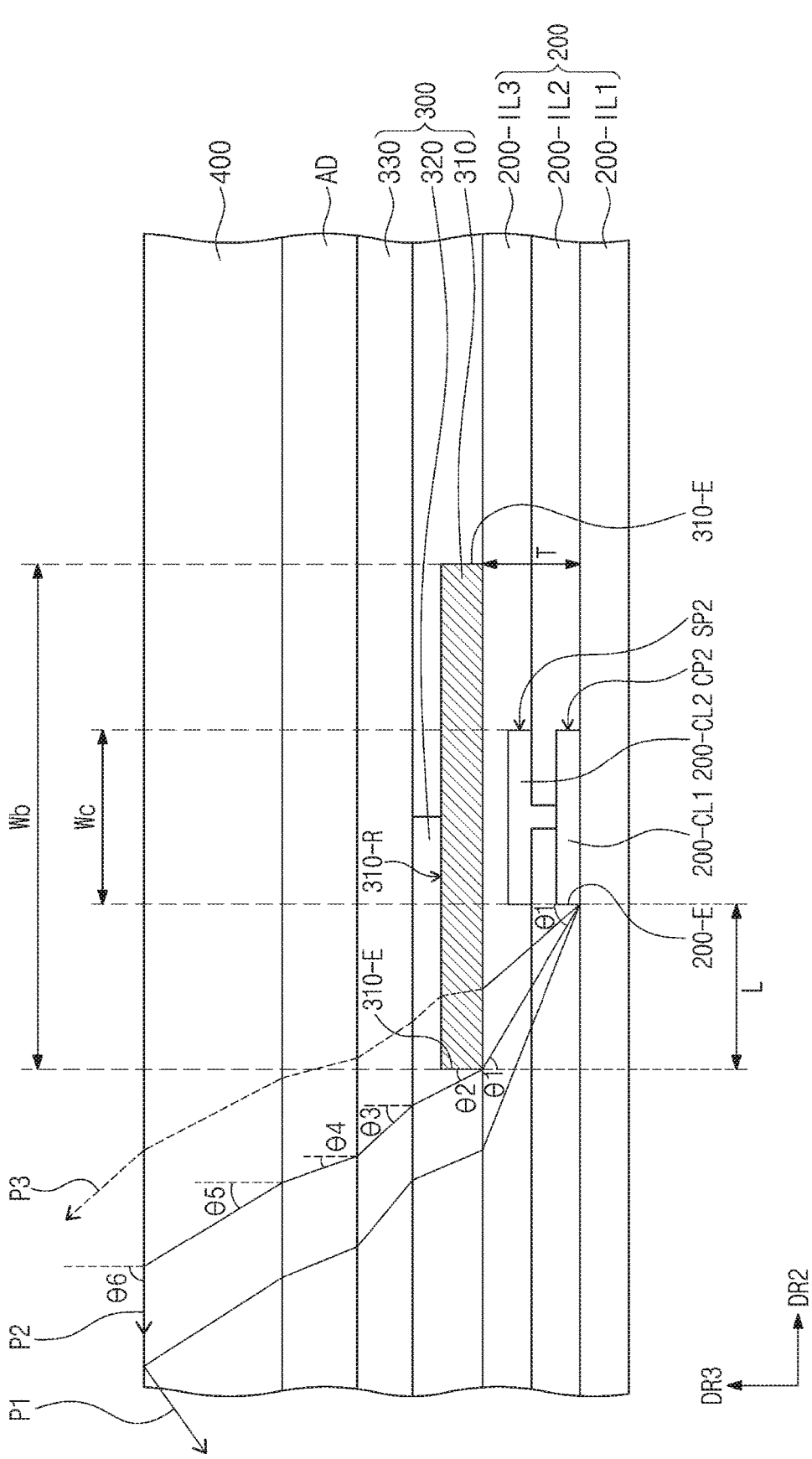
FIGS. 6A and 6B are cross-sectional views illustrating paths of light reflected from an input sensor according to an embodiment of the inventive concept.
Figure 6B:
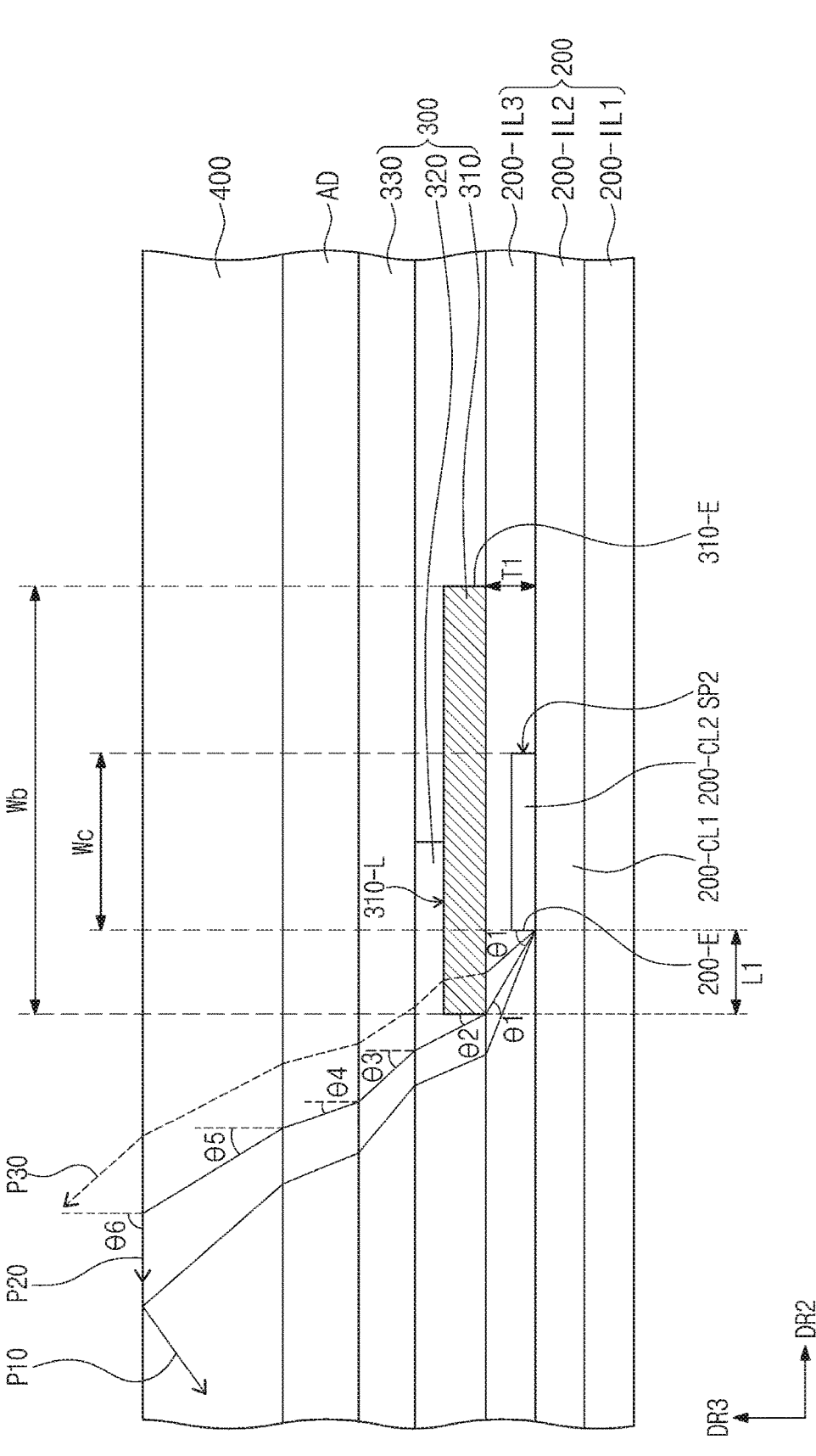
Figure 7:
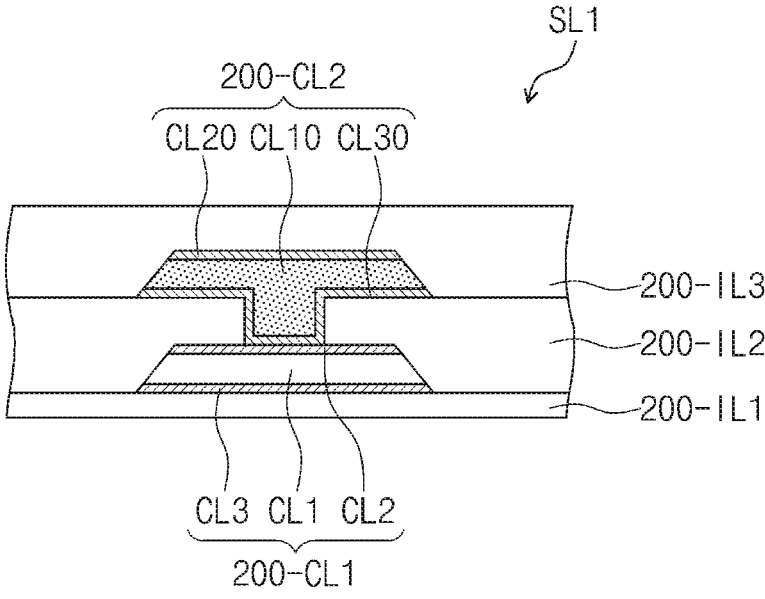
FIG. 7 is an enlarged cross-sectional view of a conductive pattern of an input sensor.

FIGS. 6A and 6B are cross-sectional views illustrating paths of light reflected from an input sensor 200 according to an embodiment of the inventive concept. FIG. 7 is an enlarged cross-sectional view of a conductive pattern of an input sensor 200.

The principle of preventing external light reflection by the light blocking pattern 310 will be described with reference to FIGS. 6A and 6B. FIG. 6A is a cross-section illustrating the first portion 310-R of the light blocking pattern 310 and the first conductive pattern 200-CL1 and the second conductive pattern 200-CL2 overlapping the first portion 310-R. FIG. 6B is a cross-section illustrating the second portion 310-L of the light blocking pattern 310 and the second conductive pattern 200-CL2 overlapping the second portion 310-L. FIGS. 6A and 6B illustrate cross-sections in a second direction DR2 orthogonal to the first direction DR1, assuming that conductive patterns of the bridge pattern CP2 and the sensing pattern SP2 extend in the first direction DR1.

In some embodiments, the second insulating layer 200-IL2 and the third insulating layer 200-IL3 may have the same refractive index as each other. The second insulating layer 200-IL2 and the third insulating layer 200-IL3 may include inorganic layers containing the same material as each other. In some embodiments, each of the second insulating layer 200-IL2 and the third insulating layer 200-IL3 may be a single-inorganic layer.

FIG. 6A illustrates three paths P1, P2, and P3 of reflected light. External light is diffusely reflected from the first conductive pattern 200-CL1, in particular, the side of the first conductive pattern 200-CL1. The three paths P1, P2, and P3 of reflected light correspond to representative reflection paths of the diffusely reflected external light.

Reflected light along a first path P1 is totally reflected from the upper surface of the window 400 and is not emitted to the outside. Therefore, the reflected light is not perceived as reflected light by the user.

Reflected light along a second path P2 is emitted to the outside but is not substantially perceived as reflected light by the user. The reflected light along the second path P2 is emitted in a direction parallel to the upper surface of the window 400 and is not transferred to the user located in front of the window 400.

Reflected light along a third path P3 may be emitted to the outside and transferred to the user in consideration of the path itself. However, the reflected light along the third path P3 is blocked by the first portion 310-R of the light blocking pattern 310, and therefore the reflected light is not transferred to the user located in front of the window 400.

The reflected light from the first path P1 to the third path P3 follows the Snell's law of Formula 1 below.

$$ni \times \sin \theta i = n(i-1) \times \sin \theta(i-1) \qquad \text{[Formula 1]}$$

Light passing through a stacked structure including m layers follows the Snell's law when passing through two adjacent layers. In Formula 1, $\theta(i-1)$ represents the incident angle of light from the $(i-1)$-th layer to the i-th layer, and $\theta i$ represents the refraction angle of light from the $(i-1)$-th layer to the i-th layer. Here, i is greater than 1 and less than m. ni represents the refractive index of the i-th layer, and $n(i-1)$ represents the refractive index of the $(i-1)$-th layer.

The reflected light of the second path P2 satisfies Formula 2 below between the window 400 and the air layer.

$$1 \times \sin 90° = n400 \times \sin \theta 5 \qquad \text{[Formula 2]}$$

where $\theta 6$ in FIG. 6A represents a refraction angle of 90°. $\theta 5$ represents an incident angle. The refractive index of an air layer is 1, and n400 is the refractive index of the window 400.

Since the Snell's law is also satisfied between two adjacent layers of the stacked structure under the window 400, Formula 2 may be finally transformed into Formula 3 below.

$$1 \times \sin 90° = n(200\text{-}IL2) \times \sin \theta 1 \qquad \text{[Formula 3]}$$

where $n(200\text{-}IL2)$ represents the refractive index of the second insulating layer 200-IL2. According to Formula 3, an incident angle of the reflected light having the second path P2 with respect to the color filter 320 is determined by the refractive index of the second insulating layer 200-IL2. Since it is assumed that the refractive indexes of the second insulating layer 200-IL2 and the third insulating layer 200-IL3 are the same as each other, the insulating layers 200-IL2 and 200-IL3 between the light blocking pattern 310 and the first conductive pattern 200-CL1 may be considered as a single insulating layer.

In order to block all light in paths defined between the second path P2 and the third path P3, the light blocking pattern 310 may satisfy the conditions of Formula 4 and Formula 5.

$$\frac{L}{T} = \tan(\Theta1)$$ [Formula 4]

$$L \geq T \times \tan\left(\arcsin\left(\frac{1}{n1} \times \sin 90°\right)\right)$$ [Formula 5]

"L" represents a distance between an edge 310-E of the light blocking pattern 310 and an edge 200-E of the first conductive pattern 200-CL1 in the second direction DR2. The distance is the shortest distance when viewed in a plan view. For example, the edge 310-E of the light blocking pattern 310, when viewed in a plan view, may be spaced apart from the edge 200-E of the first conductive pattern 200-CL1 in the second direction DR2 at the distance of L.

"T" represents a distance (in other words, the sum of the thicknesses of the second insulating layer 200-IL2 and the third insulating layer 200-IL3 measured at the edge 310-E of the light blocking pattern 310) between the upper surface of the first insulating layer 200-IL1 and the lower surface of the light blocking pattern 310, and n1 represents the refractive index of the second insulating layer 200-IL2. In some embodiments, "T" is equal to the sum of the thicknesses of the second insulating layer 200-IL2 and the third insulating layer 200-IL3.

In addition, a width Wb of the light blocking pattern 310 may satisfy Formula 6 below.

$$Wb = 2 \times L + Wc$$ [Formula 6]

where Wc represents a width of the first conductive pattern 200-CL1 in the second direction DR2.

When the condition that the left component of Formula 5 is larger than the right component is satisfied, the light blocking pattern 310 may sufficiently block the light of the second path P2 and the third path P3, but the width Wb of the light blocking pattern 310 is increased. Thus, the area of the pixel region PXA illustrated in FIG. 5 may be reduced.

In order to solve the above-described limitation, the width Wb of the light blocking pattern 310 may be determined in a range in which the pixel region PXA (see FIG. 5) does not become smaller than the light-emitting region LA (see FIG. 5). A distance L between the edge 310-E of the light blocking pattern 310 and the edge 200-E of the first conductive pattern 200-CL1 may be smaller than a distance L0 (see FIG. 5) between the edge 200-E of the first conductive pattern 200-CL1 and the edge LA-E of the light-emitting region LA. The edge LA-E of the light-emitting region LA may be defined to be the same as the edge of the opening PDL-OP of the pixel defining layer PDL.

When the width Wb of the light blocking pattern 310 satisfies Formula 6, all of the reflected light, which does not satisfy the condition of total reflection on the upper surface of the window 400, among the light reflected from the second conductive pattern 200-CL2 may be blocked by the light blocking pattern 310. Since the second conductive pattern 200-CL2 is closer to the light blocking pattern 310 than the first conductive pattern 200-CL1, an incident angle θ1 of the reflected light reflected from the second conductive pattern 200-CL2 becomes greater than that of reflected light reflected from the first conductive pattern 200-CL1 in order for the reflected light reflected from the second conductive pattern 200-CL2 to be incident on the color filter 320. That is, all of the reflected light incident on the color filter 320 after being reflected from the second conductive pattern 200-CL2 moves along the first path P1.

Referring to FIG. 6B, in order to block all light in paths defined between a second path P20 and a third path P30, the second portion 310-L of the light blocking pattern 310 may satisfy the condition of Formula 7.

$$L1 \geq T1 \times \tan\left(\arcsin\left(\frac{1}{n1} \times \sin 90°\right)\right)$$ [Formula 7]

"L1" represents a distance between the edge 310-E of the second portion 310-L of the light blocking pattern 310 and an edge 200-E of the second conductive pattern 200-CL2 in the second direction DR2. The distance of L1 may be the shortest distance between the edge 310-E of the second portion 310-L of the light blocking pattern 310 and the edge 200-E of the second conductive pattern 200-CL2 in the second direction DR2. For example, the edge 310-E of the second portion 310-L of the light blocking pattern 310, when viewed in a plan view, may be spaced apart from the edge 200-E of the second conductive pattern 200-CL2 in the second direction DR2 at the distance of L1.

'T1' represents a distance between an upper surface of the second insulating layer 200-IL2 and a lower surface of the light blocking pattern 310, and n1 represents the refractive index of the third insulating layer 200-IL3. In some embodiments, "T1" is equal to the thickness of the third insulating layer 200-IL3 measured at the edge 310-E of the light blocking pattern 310.

Comparing FIG. 6A and FIG. 6B, the width of the second portion 310-L of the light blocking pattern 310 in FIG. 6B may be smaller than the width of the first portion 310-R of the light blocking pattern 310 in FIG. 6A even if the same light blocking effect is satisfied. The third insulating layer 200-IL3 is uniformly formed in the sensing region 200-DA, and as a result, T1 of Formula 7 is smaller than T of Formula 5.

In FIGS. 6A and 6B, the first conductive pattern 200-CL1 and the second conductive pattern 200-CL2 are simply illustrated as a single layer, but as illustrated in FIG. 7, the first conductive pattern 200-CL1 and the second conductive pattern 200-CL2 may have a multilayer structure.

The first conductive pattern 200-CL1 may include a first conductive layer CL1 having relatively high conductivity, a second conductive layer CL2 disposed above the first conductive layer CL1, and a third conductive layer CL3 disposed under the first conductive layer CL1. The third conductive layer CL3 may have a greater bonding force to the first insulating layer 200-IL1 than the first conductive layer CL1, and the second conductive layer CL2 may have a smaller reflectance than the first conductive layer CL1. The first conductive layer CL1 may have a higher conductivity than the second conductive layer CL2. The first conductive layer CL1 having a low resistance corresponds to an effective signal movement path. The first conductive layer CL1 may have a thickness greater than those of the second conductive layer CL2 and the third conductive layer CL3.

The second conductive layer CL2 and the third conductive layer CL3 may contain the same material as each other. The first conductive layer CL1 may be aluminum, and the second conductive layer CL2 and the third conductive layer CL3 may be titanium. Although some of the first conductive layer CL1, the second conductive layer CL2, and the third conductive layer CL3 may contain different materials, the first conductive layer CL1, the second conductive layer CL2, and the third conductive layer CL3 may each contain a material that is etchable with a same etchant or an etchant of the same series. Aluminum and titanium may be etched with a fluorine-based etchant. Accordingly, the stacked titanium layer, the aluminum layer, and the titanium layer of the first conductive layer CL1 may be patterned through a single etching process.

The first conductive pattern 200-CL1 may have an inclined side surface by the etching process. This is because the etch rate of the conductive layer disposed on the upper side is higher.

The second conductive pattern 200-CL2 may have the same or different stacked structure as the first conductive pattern 200-CL1. The second conductive pattern 200-CL2 may include a first conductive layer CL10, a second conductive layer CL20 disposed above the first conductive layer CL10 and in contact with the first conductive layer CL10, and a third conductive layer CL30 disposed under the first conductive layer CL10 and in contact with the first conductive layer CL10. In an embodiment of the inventive concept, the third conductive layer CL30 may be omitted.

The first conductive layer CL10 has a first reflectance, a first conductivity, and a first thickness. The second conductive layer CL20 has a second reflectance lower than the first reflectance, a second conductivity lower than the first conductivity, and a second thickness smaller than the first thickness. The first conductive layer CL10 having a low resistance corresponds to an effective signal movement path. The second conductive layer CL20 having a low reflectance covers the first conductive layer CL10 to reduce the reflectance of external light.

Figure 8:
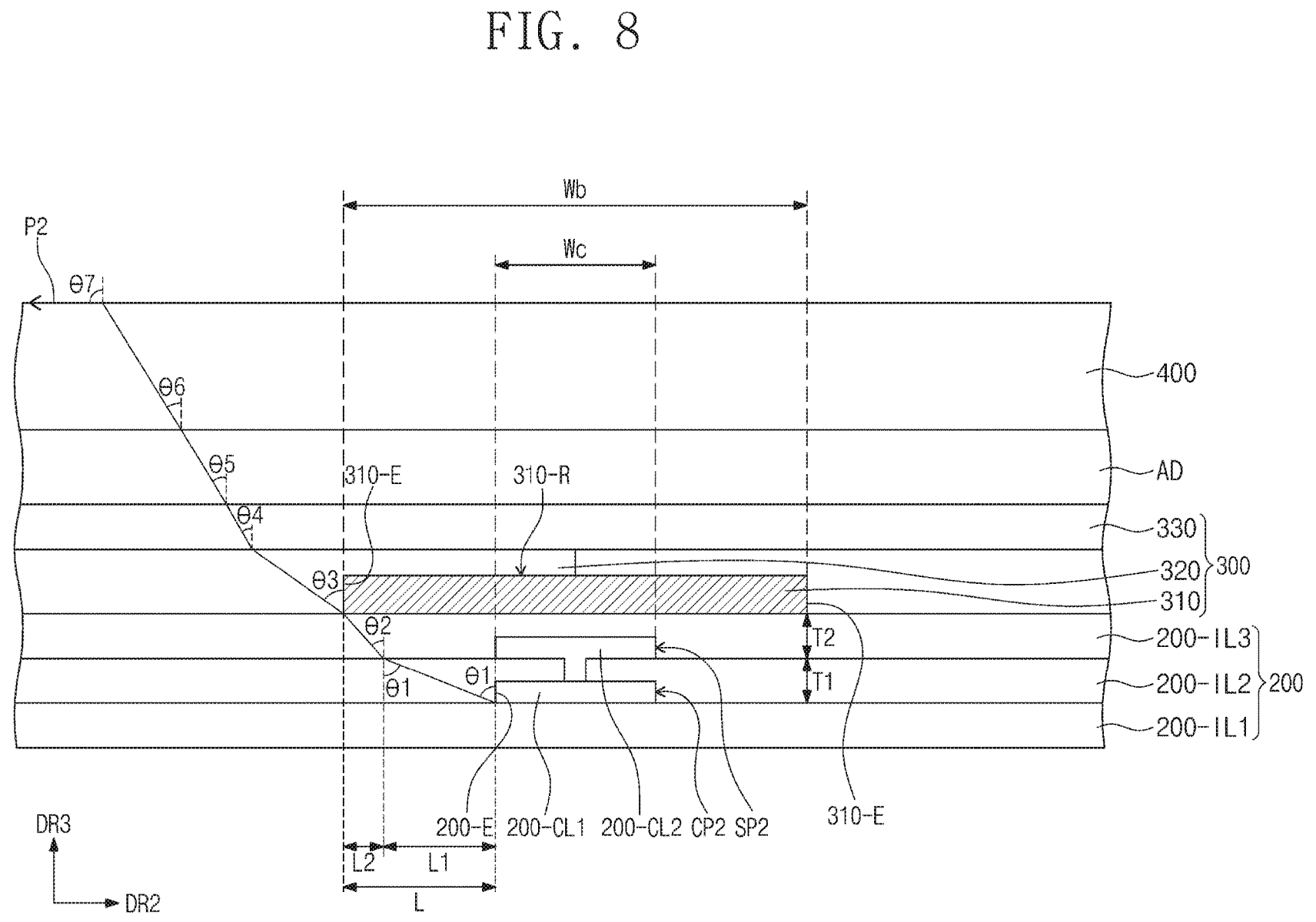
Figure 9:
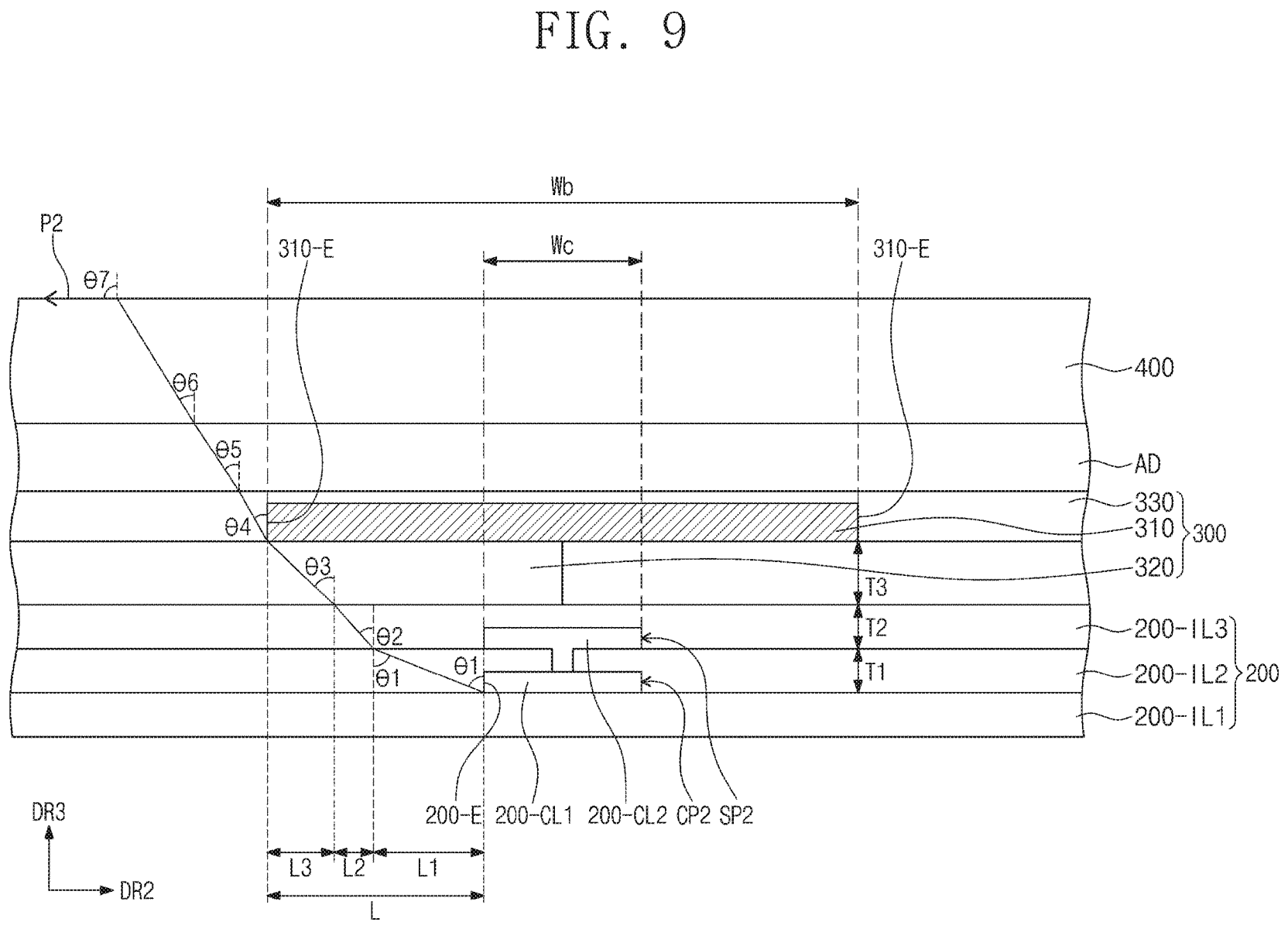

FIGS. 8 and 9 are cross-sectional views illustrating paths of light reflected from an input sensor 200 according to an embodiment of the inventive concept. Hereinafter, a detailed description of the same configuration as the configuration described with reference to FIGS. 1 to 7 will be omitted.

In FIG. 8, a second insulating layer 200-IL2 and a third insulating layer 200-IL3 may have different refractive indexes from each other. In one embodiment, the second insulating layer 200-IL2 may include or may be formed of a first inorganic layer, and the third insulating layer 200-IL3 may include or may be formed of a second inorganic layer made of a material different from that of the first inorganic layer. In an embodiment, the second insulating layer 200-IL2 may include or may be formed of an inorganic layer, and the third insulating layer 200-IL3 may include or may be formed of an organic layer.

The light blocking pattern 310 may satisfy the conditions of Formula 8 to Formula 10 below. A distance L between the edge 310-E of the first portion 310-R of the light blocking pattern 310 and the edge 200-E of the first conductive pattern 200-CL1 may satisfy the conditions of Formula 8 to Formula 10 below. The distance L may be the shortest distance between the edge 310-E of the first portion 310-R of the light blocking pattern 310 and the edge 200-E of the first conductive pattern 200-CL1 when viewed in a plan view. For example, the edge 310-E of the first portion 310-R of the light blocking pattern 310, when viewed in a plan view, may be spaced apart from the edge 200-E of the first conductive pattern 200-CL1 at the distance of L.

$$L \geq L1 + L2 \qquad \text{[Formula 8]}$$

$$L1 = T1 \times \tan\left(\arcsin\left(\frac{1}{n1} \times \sin90°\right)\right) \qquad \text{[Formula 9]}$$

-continued $$L2 = T2 \times \tan\left(\arcsin\left(\frac{1}{n2} \times \sin90°\right)\right) \qquad \text{[Formula 10]}$$

When the reflected light travels along the second path P2, L1 represents a distance by which the reflected light travels in the second direction DR2 while passing through the second insulating layer 200-IL2, and L2 represents a distance by which the reflected light travels in the second direction DR2 while passing through the third insulating layer 200-IL3.

T1 represents the thickness of the second insulating layer 200-IL2, n1 represents the refractive index of the second insulating layer 200-IL2, T2 represents the thickness of the third insulating layer 200-IL3, and n2 represents the refractive index of the third insulating layer 200-IL3.

When the light blocking pattern 310 satisfies the conditions of Formula 8 to Formula 10, the reflected light having a smaller incident angle than the second path P2 may be blocked by the light blocking pattern 310. For example, a reflected light of the third path P3 in FIG. 6A may be blocked.

Although not illustrated separately, the width of the second portion 310-L of the light blocking pattern 310 may be the same as that described with reference to FIG. 6B. That is, even if the input sensor 200 includes the second insulating layer 200-IL2 and the third insulating layer 200-IL3 having different refractive indexes, a distance L1 (see FIG. 6B) between an edge 310-E of the second portion 310-L of the light blocking pattern 310 and the edge 200-E of the first conductive pattern 200-CL1 may be determined by the refractive index and thickness of the third insulating layer 200-IL3.

Referring to FIG. 9, a second insulating layer 200-IL2, a third insulating layer 200-IL3, and a color filter 320 are disposed between the light blocking pattern 310 and the first conductive pattern 200-CL1. Since the color filter 320 corresponds to one type of insulating layers, it appears that three insulating layers are disposed between the light blocking pattern 310 and the first conductive pattern 200-IL1.

Assuming that m layers are disposed between the light blocking pattern 310 and the first conductive pattern 200-IL1, the light blocking pattern 310 may satisfy the conditions of Formula 11 to Formula 14 below in order to reduce the reflectance of external light.

$$L \geq L1 + L2 \ ... + Lm \qquad \text{[Formula 11]}$$

$$L1 = T1 \times \tan\left(\arcsin\left(\frac{1}{n1} \times \sin90°\right)\right) \qquad \text{[Formula 12]}$$

$$L2 = T2 \times \tan\left(\arcsin\left(\frac{1}{n2} \times \sin90°\right)\right) \qquad \text{[Formula 13]}$$

$$Lm = Tm \times \tan\left(\arcsin\left(\frac{1}{nm} \times \sin90°\right)\right) \qquad \text{[Formula 14]}$$

T1 represents the thickness of a first insulating layer in contact with the first conductive pattern 200-IL1, and n1 represents the refractive index of the first insulating layer. T2 represents the thickness of a second insulating layer, and n2 represents the refractive index of the second insulating layer. Tm represents the thickness of an m-th insulating layer in contact with the light blocking pattern 310, and nm is the refractive index of the m-th insulating layer. Tm is a measurement of the thickness of the m-th insulating layer at the edge 310-E of the light blocking pattern 310. The second insulating layer may be disposed between the first insulating layer and the m-th insulating layer.

In FIG. 9, m is 3, the second insulating layer 200-IL2 corresponds to the first insulating layer, the third insulating layer 200-IL3 corresponds to the second insulating layer, and the color filter 320 corresponds to the third insulating layer.

Figure 10A:
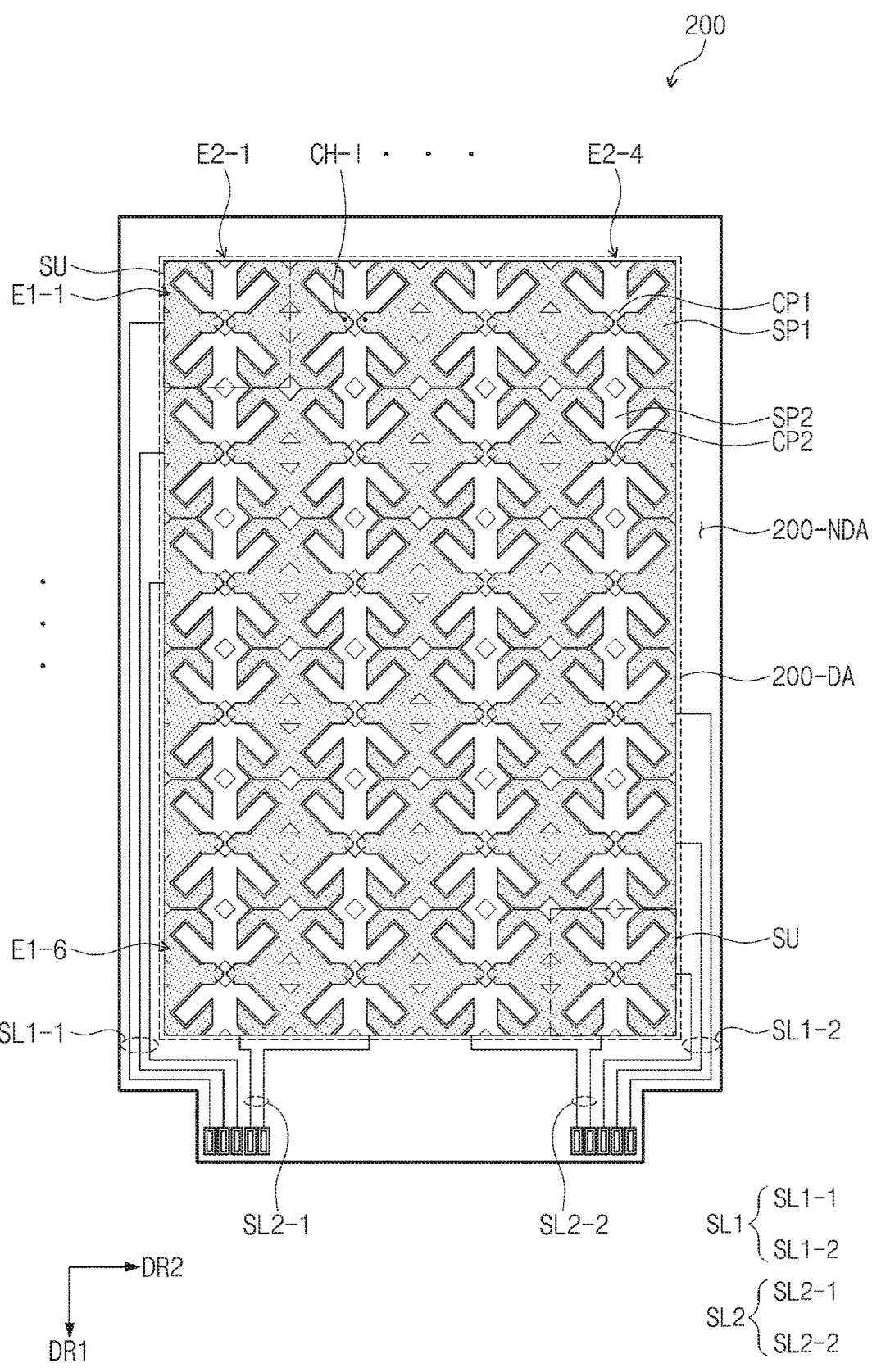
FIG. 10A is a plan view of an input sensor according to an embodiment of the inventive concept.
Figure 10B:
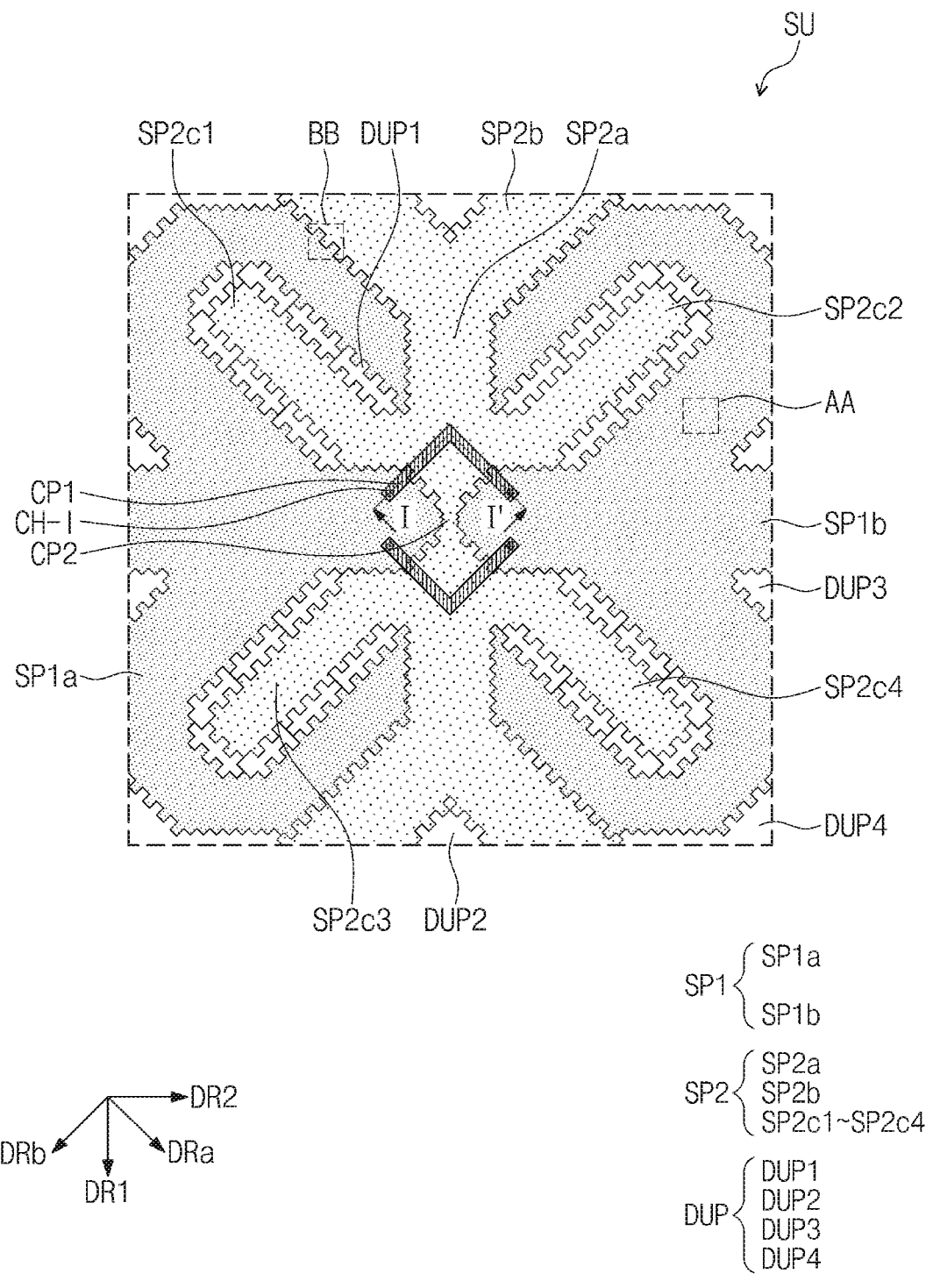
FIG. 10B is an enlarged plane view of a sensing unit illustrated in FIG. 10A.
Figure 10C:
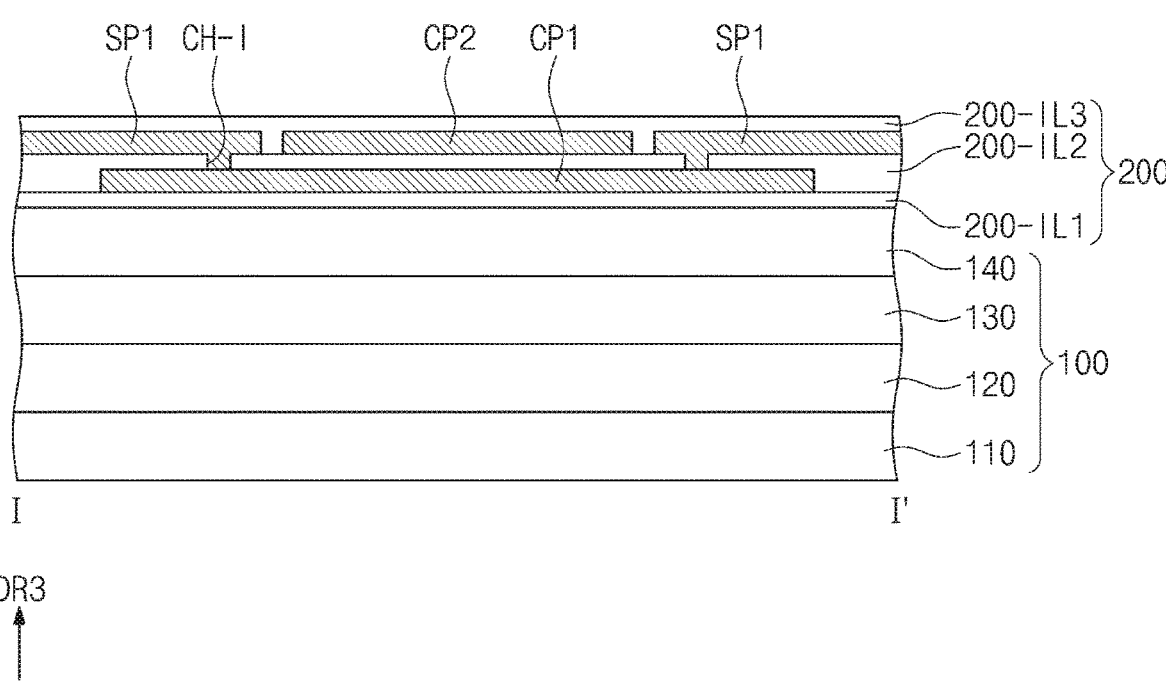
FIG. 10C is a cross-sectional view taken along line I-I' of FIG. 10A.

FIG. 10A is a plan view of an input sensor 200 according to an embodiment of the inventive concept. FIG. 10B is an enlarged plane view of a sensing unit SU illustrated in FIG. 10A. FIG. 10C is a cross-sectional view taken along line I-I' of FIG. 10A.

Hereinafter, an input sensor 200 according to an embodiment different from the input sensor 200 illustrated in FIG. 4 will be described in detail. However, a duplicate description of the same configuration as the input sensor 200 described with reference to FIG. 4 will be omitted. Even if the input sensor 200 to be described below is applied to the display device illustrated in FIGS. 1A to 9, the effect of reducing the amount of external light reflection may be achieved as described above.

The input sensor 200 in FIG. 10A is illustrated to differ from the input sensor 200 in FIG. 4 in terms of a below-described configuration. Referring to FIG. 10A, six first electrodes E1-1 to E1-6 are exemplary illustrated. The first signal lines SL1 in a first group SL1-1 are respectively connected to sides of some first electrodes of the first electrodes E1-1 to E1-6. The first signal lines SL1 in a second group SL1-2 are respectively connected to the other sides of the remaining first electrodes of the first electrodes E1-1 to E1-6. The second signal lines SL2 in a first group SL2-1 are respectively connected to sides of some second electrodes of the second electrodes E2-1 to E2-4. The second signal lines SL2 in a second group SL2-2 are respectively connected to sides of the remaining second electrodes of the second electrodes E2-1 to E2-4. The first signal lines SL1 in the first group SL1-1 and the second signal lines SL2 in the first group SL2-1 are aligned, and the first signal lines SL1 in the second group SL1-2 and the second signal lines SL2 in the second group SL2-2 are aligned.

According to some embodiments, each of the first electrodes E1-1 to E1-6 includes the sensing patterns SP1 and the bridge patterns CP1. Each of the second electrodes E2-1 to E2-4 may include integral sensing portions SP2 and intermediate portions CP2. Each of the first electrodes E1-1 to E1-6 and the second electrodes E2-1 to E2-4 may have a mesh shape. In other words, each of the first electrodes E1-1 to E1-6 and the second electrodes E2-1 to E2-4 may include a plurality of conductive lines that cross each other to form a mesh.

According to some embodiments, the sensing region 200-DA may include a plurality of sensing units SU. The entirety of sensing region 200-DA may be divided into the plurality of sensing units SU, or a portion of the sensing region 200-DA may be divided into the plurality of sensing units SU.

The sensing units SU may have the same area as each other. According to some embodiments, each of the sensing units SU includes a corresponding crossing region among the crossing regions of the first electrodes E1-1 to E1-6 and the second electrodes E2-1 to E2-4.

Each of the sensing units SU may include a half sensing pattern SP1 and another half sensing pattern SP1 with the bridge pattern CP1 disposed therebetween, and include a half sensing portion SP2 and another half sensing portion SP2 with the intermediate portion CP2 disposed therebetween.

Referring to FIG. 10B, each of the sensing portions SP2 may include extension portions SP2a and SP2b and branch portions SP2c1 to SP2c4. The extension portions SP2a and SP2b may include first extension portions SP2a extending side by side in the first direction DR1 and a second extension portion SP2b bent from the first extension portion SP2a and extending with a dummy pattern DUP2 therebetween. The present invention is not limited thereto. In some embodiments, the dummy pattern DUP2 according to an embodiment may not be disposed between the second extension portions SP2b, and the second extension portions SP2b may extend in a direction parallel to the first extension portions SP2a.

Each of the branch portions SP2c1 to SP2c4 may extend in a direction away from an intermediate portion CP2 with the intermediate portion CP2 interposed therebetween. The branch portions SP2c1 to SP2c4 may include first to fourth branch portions SP2c1 to SP2c4. The first branch portion SP2c1 and the fourth branch portion SP2c4 may extend along a first crossing direction DRa, and the second branch portion SP2c2 and the third branch portion SP2c3 may extend along a second crossing direction DRb.

The first crossing direction DRa may be defined as a direction crossing each of the first direction DR1 and the second direction DR2. The second crossing direction DRb may be defined as a direction that crosses each of the first and second directions DR1 and DR2 and is perpendicular to the first crossing direction DRa. The first crossing direction DRa and the second crossing direction DRb may respectively correspond to diagonal directions between the first DR1 and second directions DR2 on a plane defined by the first direction DR1 and the second direction DR2.

The first to fourth branch portions SP2c1 to SP2c4 may become far away from each other in opposite directions. For example, the first branch portion SP2c1 may become far away from the second branch portion SP2c2 in the second direction DR2, and the first branch portion SP2c1 may become far away from the third branch portion SP2c3 in the first direction DR1. The first branch portion SP2c1 may become far away from the fourth branch portion SP2c4 in the first crossing direction DRa with the intermediate portion CP2 interposed therebetween.

The intermediate portion CP2 may be disposed between portions, of the sensing patterns SP1, protruding toward each other in the second direction DR2. The intermediate portion CP2 may connect the first extension portions SP2a of the sensing portions SP2. The intermediate portion CP2 may be integrally formed with the first extension portions SP2a on the same layer.

Each of the sensing patterns SP1 may include a first portion SP1b extending along the second direction DR2 and a second portions SP1a extending from the first portion SP1b and surrounding a portion of the sensing portions SP2. The second portions SP1a of the sensing patterns SP1 may surround the branch portions SP2c1 to SP2c4 of the sensing portion SP2 disposed adjacently. Referring to FIG. 10B, in the sensing unit SU, the second portions SP1a of the sensing pattern SP1 disposed on the left side may surround the first and third branch portions SP2c1 and SP2c3, and the second portions SP1a of the sensing pattern SP1 disposed on the right side may surround the second and fourth branch portions SP2c2 and SP2c4.

The first portions SP1b of the sensing patterns SP1 may be spaced apart from each other in the second direction DR2 with the intermediate portion CP2 therebetween. The bridge pattern CP1 may electrically connect the spaced sensing patterns SP1. FIG. 10B illustrates two bridge patterns CP1 disposed in the sensing unit SU. However, the number of bridge patterns CP1 disposed in the sensing unit SU is not limited thereto. In some embodiments, the number of bridge patterns CP1 may be less or more than two.

As illustrated in FIG. 10B, each of the bridge patterns CP1 may have a crooked line shape of "A" or "V" on a plane. The bridge patterns CP1 having crooked line shapes may overlap the sensing portions SP2. However, an embodiment of the inventive concept is not limited thereto. In some embodiments, each of the bridge patterns CP1 may have a shape of a straight line extending along the second direction DR2 and may overlap the intermediate portion CP2 on a plane.

Each of the dummy patterns DUP may be electrically floating patterns. Each of the dummy patterns DUP may be insulated from the first electrodes E1-1 to E1-6 and the second electrodes E2-1 to E2-4. The dummy patterns DUP may include first to fourth dummy patterns DUP1 to DUP4 according to arrangement positions.

The first dummy patterns DUP1 may be disposed between the first sensing electrodes E1-1 to E1-6 and the second sensing electrodes E2-1 to E2-4. Specifically, the first dummy patterns DUP1 may be disposed between the first sensor portions SP1 and the sensing portions SP2. For example, as illustrated in FIG. 10B, the first dummy patterns DUP1 may be disposed between the second portions SP1a of the first sensor portions SP1 and the branch portions SP2c1 to SP2c4 of the sensing portions SP2 and surround the branch portions SP2c1 to SP2c4.

As the first dummy patterns DUP1 are disposed between the sensing patterns SP1 and the sensing portions SP2, mutual capacitances between the sensing patterns SP1 and the sensing portions SP2 may be reduced. However, even when the first dummy patterns DUP1 are disposed, the amount of change in a mutual capacitance due to the occurrence of a touch event may not be significantly reduced. Accordingly, the value of (change in mutual capacitance)/(mutual capacitance) may be increased by the first dummy patterns DUP1.

Accordingly, a ghost touch phenomenon occurring in a specific environment by the first dummy patterns DUP1 may be reduced. The ghost touch refers to a phenomenon in which a noise signal, not a signal generated by an actual touch event, is amplified, and recognized as a touch. For example, in a low temperature state, when the temperature of a portion of the sensing region is increased by an operation such as touch events and the entire sensing region is turned on, an operation would be performed as if a touch occurred in a region where a touch event did not occur in the sensing region. However, since the ghost touch phenomenon may be reduced by the first dummy patterns DUP1, the reliability of the input detection sensor ISP may be improved.

Spaces between the sensing patterns SP1 and the sensing portions SP2 may be increased by the first dummy patterns DUP1, which makes it possible to reduce the probability that the sensing patterns SP1 and the sensing portions SP2 are short-circuited to each other. For example, when the first dummy patterns DUP1 are not disposed, the spaces between the sensing patterns SP1 and the sensing portions SP2 may be on a scale of about 4 µm to about 5 µm. However, when the first dummy patterns DUP1 are disposed, the spaces between the sensing patterns SP1 and the sensing portions SP2 may be increased up to a scale of about 70 µm or more. Accordingly, the sensing patterns SP1 and the sensing portions SP2 may be short-circuited only when a foreign material or residue having a size of about 70 µm or more is generated in the region where the first dummy patterns DUP1 are disposed. Terms such as "about" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The first dummy patterns DUP1 may include a plurality of patterns electrically insulated from each other. The sizes of the plurality of patterns may vary depending on the sensing unit SU in consideration of the mutual capacitance and visibility. However, embodiments of the first dummy patterns DUP1 are not limited thereto.

The second dummy patterns DUP2 may be surrounded by the second extension portions SP2b of the above-described sensing portion SP2. The third dummy patterns DUP3 may be surrounded by the sensing pattern SP1. The fourth dummy patterns DUP4 may be disposed between the first sensing electrodes E1-1 to E1-6 arranged along the first direction DR1. Meanwhile, at least some of the first to fourth dummy patterns DUP1 to DUP4 may be omitted according to an embodiment.

Referring to FIG. 9, the lower configuration of the input sensor 200 is schematically illustrated, and the upper configuration thereof is not illustrated. The bridge pattern CP1 may be disposed on a layer different from the sensing pattern SP1, the sensing portion SP2, and the intermediate portion CP2. Referring to FIG. 3, the bridge pattern CP1 may be formed from the first conductive pattern layer 200-CL1, and the remainder may be formed from the second conductive pattern layer 200-CL2. The sensing pattern SP1 may be connected to the bridge pattern CP1 through the contact hole CH-I penetrating the second insulating layer 200-IL2.

According to an embodiment of the inventive concept, it is possible to reduce the reflection of external light that is generated at the conductive pattern of the input sensor. The area of the pixel region may be increased and the area of the non-pixel region may be decreased.

Although the embodiments of the present invention have been described, it is understood that the present invention should not be limited to these embodiments, but various changes and modifications can be made by one ordinary skilled in the art within the spirit and scope of the present invention as hereinafter claimed.

What is claimed is:

1. A display device comprising:
a display panel including a light-emitting region and a non-light-emitting region;
an input sensor including:
a first conductive pattern overlapping the non-light-emitting region and extending in a first direction, and
an insulating layer disposed on the first conductive pattern, the input sensor being disposed on the display panel;
a light blocking pattern overlapping the first conductive pattern and disposed on the insulating layer; and
a window disposed on the light blocking pattern,
wherein a first distance between how far an edge of the light blocking pattern extends beyond an edge of the first conductive pattern, in a second direction orthogonal to the first direction, satisfies Formula 1 below:

$$L \geq T \times \tan\left(\arcsin\left(\frac{1}{n1} \times \sin 90°\right)\right), \qquad \text{[Formula 1]}$$

where:

L represents the first distance,

T represents a thickness of the insulating layer measured at the edge of the light blocking pattern, and n1 is a refractive index of the insulating layer.

2. The display device of claim 1, wherein the insulating layer comprises a plurality of inorganic layers including the same material as each other.

3. The display device of claim 2, wherein the input sensor further comprises a second conductive pattern, and wherein the second conductive pattern is disposed in at least two inorganic layers of the plurality of inorganic layers.

4. The display device of claim 1, further comprising a color filter overlapping the light-emitting region and disposed on the insulating layer, wherein a portion of the color filter is disposed on the light blocking pattern.

5. The display device of claim 1, wherein, in the second direction, the first distance is smaller than a distance between the edge of the first conductive pattern and an edge of the light-emitting region.

6. The display device of claim 1, wherein, in the second direction, a width of the light blocking pattern satisfies Formula 2 below:

$$Wb=2\times L+Wc \qquad \text{[Formula 2]}$$

where:

Wb represents a width of the light blocking pattern in the second direction, and Wc is a width of the first conductive pattern in the second direction.

7. The display device of claim 1, wherein the first conductive pattern comprises an inclined side surface.

8. A display device comprising:

a display panel including a light-emitting region and a non-light-emitting region;

an input sensor including:

a first conductive pattern overlapping the non-light-emitting region and extending in a first direction, and an insulating layer disposed on the first conductive pattern, the input sensor being disposed on the display panel;

a light blocking pattern overlapping the first conductive pattern and disposed on the insulating layer, wherein when viewed in a plan view, an edge of the light blocking pattern is spaced apart from an edge of the first conductive pattern at a first distance; and a window disposed on the light blocking pattern, wherein the first distance between an edge of the light blocking pattern and an edge of the first conductive pattern in a second direction orthogonal to the first direction satisfies Formula 1 below:

$$L \geq T \times \tan(\arcsin(1/n1 + \sin 90°))$$

where:

L represents the first distance,

T represents a thickness of the insulating layer measured at the edge of the light blocking pattern, and n1 is a refractive index of the insulating layer, wherein the input sensor further comprises a base insulating layer disposed between the display panel and the first conductive pattern, and wherein the first conductive pattern includes:

a first conductive layer having a first reflectance and a first conductivity;

a second conductive layer having a second reflectance lower than the first reflectance, having a second conductivity lower than the first conductivity, the second conductive layer being disposed on the first conductive layer and contacting the first conductive layer; and a third conductive layer disposed between the base insulating layer and the first conductive layer, and contacting each of the base insulating layer and the first conductive layer.

9. The display device of claim 8, wherein the third conductive layer comprises the same material as the first conductive layer.

10. The display device of claim 8, wherein the first conductive layer is thicker than the second conductive layer.

* * * * *